United States Patent
Matsumura et al.

(10) Patent No.: US 7,335,261 B2
(45) Date of Patent: Feb. 26, 2008

(54) APPARATUS FOR FORMING A SEMICONDUCTOR THIN FILM

(75) Inventors: Masakiyo Matsumura, Kamakura (JP); Mikihiko Nishitani, Nara (JP); Yoshinobu Kimura, Tokyo (JP); Masayuki Jyumonji, Yokohama (JP); Yukio Taniguchi, Yokohama (JP); Masato Hiramatsu, Tokyo (JP); Fumiki Nakano, Kamakura (JP)

(73) Assignee: Kabushiki Kaisha Ekisho Sentan Gijutsu Kaihatsu Center, Yokohama-Shi (JP)

( * ) Notice: Subject to any disclaimer, the term of this patent is extended or adjusted under 35 U.S.C. 154(b) by 354 days.

(21) Appl. No.: 11/198,656

(22) Filed: Aug. 5, 2005

(65) Prior Publication Data

US 2005/0272274 A1    Dec. 8, 2005

Related U.S. Application Data

(62) Division of application No. 10/366,754, filed on Feb. 13, 2003, now Pat. No. 6,946,367.

(30) Foreign Application Priority Data

Feb. 28, 2002 (JP) ............................... 2002-53130

(51) Int. Cl.
*C30B 1/04* (2006.01)
(52) U.S. Cl. ................. 117/201; 117/202; 117/204; 117/5; 117/8; 117/9
(58) Field of Classification Search ............... 117/201, 117/202, 5, 8, 9, 204
See application file for complete search history.

(56) References Cited

U.S. PATENT DOCUMENTS

2002/0009818 A1    1/2002   Yoshimoto

FOREIGN PATENT DOCUMENTS

WO    WO 01/18854 A1    3/2001

OTHER PUBLICATIONS

"Advanced Excimer-Laser Annealing Process for Quasi Single-Crystal Silicon Thin-Film Devices," by Matsakiyo Matsumura, Chang-Ho Oh, published in *Thin Solid Films*, 337 (1999) pp. 123-128, copyright text 1999 Elsevier Science S.A.

(Continued)

*Primary Examiner*—Robert Kunemund
(74) *Attorney, Agent, or Firm*—Graybeal Jackson Haley LLP

(57) ABSTRACT

Disclosed are apparatus for forming a semiconductor film having an excellent crystallinity from a non-single crystal semiconducting layer formed on a base layer made of an insulating material. The apparatus includes a light source, a homogenizer for homogenizing an intensity distribution of the emitted light, an amplitude-modulation means for performing the amplitude-modulation such that the amplitude of the light, of which the intensity distribution is homogenized, is increased in the direction of the relative motion of the light to the base layer, an optional light projection optical system for projecting the amplitude-modulated light onto the surface of the non-single crystal semiconductor such that a predetermined irradiation energy can be obtained, a phase shifter for providing a low temperature point in the surface irradiated by the light, and a substrate stage to move the light relative to the substrate thereby enabling scanning in the X and Y axis.

12 Claims, 11 Drawing Sheets

OTHER PUBLICATIONS

"Preparation of Giant-Grain Seed Layer for Poly-Silicon Thin-Film Solar Cells," by Wen-Chang Yeh and Masakiyo Matsumura, published in Jpn. J. Appl. Phys. vol. 38 (1999) pp. L110-L112, Part 2, No. 2A, Feb. 1, 1999, copyright text 1998 Publication Board, Japanese Journal of Applied Physics.

"Preparation of Position-Controlled Crystal-Silicon Island Arrays by Means of Excimer-Laser Annealing," by Chang-Ho Oh and Masakiyo Matsumura, published in Jpn. J. Appl. Phys. vol. 37 (1998) pp. 5474-5479, copyright text 1998 Publication Board, Japanese Journal of Applied Physics.

"A Projection-Type Excimer-Laser Crystallization System for Ultra-Large Grain Growth of Si Thin-Films," by Chang-Ho Oh, Mitsuru Nakata and Masakiyo Matsumura, published in Mat. Res. Soc. Symp. Proc. vol. 558, pp. q87-192, Copyright text 2000 Materials Research Society.

(a)

(b)

(a)

(b)

(a)

(b)

(a)

(b)

Prior Art

Prior Art

Prior Art

Prior Art

Prior Art

APPARATUS FOR FORMING A SEMICONDUCTOR THIN FILM

CROSS-REFERENCE TO RELATED APPLICATION

The applicants hereby claim benefit of division U.S. patent application Ser. No. 10/366,754, filed 13 Feb. 2003 now U.S. Pat. No. 6,946,367, which claims priority to Japanese patent application No. 2002-53130, filed Feb. 28, 2002, which are incorporated herein by reference.

BACKGROUND OF THE INVENTION

1. Field of the Invention

The present invention relates to a method and apparatus for forming a semiconductor thin film on a base layer made of an insulating material.

2. Prior Art

It is known well to form a semiconductor thin film on a base layer by mean of a laser crystallization method. More particularly, in this method, the base layer made of an insulating material is first prepared for instance in the form of an amorphous substrate, or especially in the form of a low cost glass substrate. Then, there is formed on the above substrate a semiconductor thin film having excellent crystallinity like a silicon (Si) thin film. Furthermore, this thin film is processed by means of an ultraviolet (UV) pulse laser, thereby the semiconductor thin film being poly-crystallized, eventually. The method of this kind is already fitted for practical use.

However, a silicon thin film produced by the currently available laser crystallization technique is a poly-crystal thin film, of which the average grain size is several hundreds nanometer (nm) and the mobility is 200 m$^2$/V○sec at the most due to the influence of a grain boundary.

In a thin film transistor using these thin films, the channel length L of the transistor has to be ten times or more as long as the grain size, that is, about several μm if taking account of dispersion in the electric performance of the thin film transistor. As a result, a circuit which can be designed by using this transistor is only a driving circuit of which the cutoff frequency is 5 MHz or so at the most.

If intending to design such a high performance driving circuit that is operable at a frequency of 100 MHz, it will be roughly estimated that a thin film transistor has to have a channel length of 1 μm and the thin film constituting it has to have a mobility of 300 m$^2$/V○sec or so. Moreover, the transistor has to have the least or no dispersion in its electric performance. In other words, the semiconductor thin film (Si thin film) formed on the amorphous substrate is required to have the grain size of 1 μm or more and also to have no grain boundary in the channel to be formed in the above thin film.

As a laser crystallization method satisfying the above requirements, there have been proposed a Sequential Lateral Solidification (SLS) Method (the first prior art), and a Phase Sifter Crystallization Method (the second prior art).

<<First Prior Art>>

The SLS method is made up of combination of the Super Lateral Growth (SLG) phenomena and the Step-and-Repeat method taken at a stage as needed.

Referring to FIG. 7, a reference numeral 71 indicates an excimer laser, 72 an emitted laser beam, 73 a laser homogenizer, 74 a line beam (homogenized laser light), 75 an amorphous substrate, 76 a non-single crystal semiconductor layer, and 77 a poly-crystallized semiconductor layer.

Heretofore, the semiconductor thin film for use in the thin film transistor as used in a liquid crystal display has been made of an amorphous silicon thin film. In general, the mobility in the amorphous silicon thin film is about 1 cm$^2$/V○sec. This value is enough for a switching transistor for use in a liquid crystal display panel of the active matrix type. However, as a result of recent research and development for improving the performance of the thin film transistor formed on the glass substrate, it has been made possible to form a silicon thin film having a mobility of 100 cm$^2$/V○sec even on the amorphous silicon by the thin film crystallization technique using the excimer laser as shown in FIG. 7. The thin film obtained by this crystallization technique is a poly-crystal thin film having a grain size "a" of about 300 to 500 nm. In the crystallization method using the excimer laser, the ultraviolet radiation is given to only the silicon thin film for such a very short period of time as 20 nsec or so, thereby only the silicon thin film being crystallized through the process of being melted and solidified. Consequently, as the radiation period of time is so short, there is less or no chance that the thermal damage is caused to the substrate.

In the apparatus shown in FIG. 7, a light source is constituted by a high-power pulse laser such as a xenon chloride (XeCl) laser (wavelength: 308 nm). The output form of the laser light used in the mass production process is a rectangle with a size of 2 cm×1 cm. Usually, the laser beam of this form is further processed to form a line beam of 20 cm (length b)×300 to 500 μm (width a) and at the same time, the intensity of this beam is homogenized by the homogenizer 73. A glass plate made of a parent material glass for use in the liquid crystal display is fed with a feed-pitch of 10 to 20 μm, thereby the amorphous silicon film formed on the parent glass plate being entirely crystallized.

Referring to FIG. 8, a reference numeral 72 indicates a laser beam emitted from an excimer laser, 81 a fly-eye lens of a homogenizer (73 in FIG. 7), 74 a line beam, and 82 a light projection optical system (not shown in FIG. 7)

The laser beam 72 emitted from the excimer laser have a rectangular form of 2 cm×1 cm as described in the above. The excimer laser is a considerably uniform light source comparing with an ordinary solid-state laser, but as shown in FIG. 8, it is observed that the light intensity slowly goes down in the vicinity of the edge. As shown in FIG. 8, the laser homogenizer 73 (FIG. 7) used in the above first prior art is able to divide the laser beam and to change the beam form by using the fly-eye lens 81, and further to improve the homogeneity of the beam intensity. Accordingly, if the semiconductor thin film formed on a large area substrate is scanned at a pitch of 10 to 20 μm by using the line beam 74 obtained by the way as shown in FIG. 8, a semiconductor thin film cab can be crystallized on the large area substrate.

However, the technique making use of the SLG region for obtaining a high performance Si thin film based on the basis of the first prior art shown in FIGS. 7 and 8, or on the other prior arts, has some drawbacks as described in the following, which are:

1) It is theoretically impossible to execute the step-and-repeat method when the feed-pitch exceeds the length (at most 1 μm) of the SLG. It is hardly possible to expect any improvement in productivity, accordingly.

2) There are certain restrictions on the mobility of a poly-crystal thin film as formed by the above technique. In case of a poly-crystal thin film which has grown up by allowing the grain size to become larger without controlling the position of the grain boundary, the dispersion in the grain size becomes larger. Thus, the above technique is far from practical use.

3) Residual grain boundaries exist at an interval of about several hundreds nm in the scanning direction while in the direction perpendicular to the scanning direction, crystal (lattice) defects exist at an interval of a feed-pitch. Accordingly, for the time being, it would be not suitable to apply the above technique to the thin film transistor of which the channel has a length of 1 μm.

<<Second Prior Art>>

In the above-mentioned phase shifter crystallization method, the light irradiation intensity on the substrate is varied by means of a phase shifter capable of changing the phase of at least a part of the light with reference to a predetermined design of light irradiation intensity, thereby controlling the lateral crystal growth and obtaining a crystal having a large crystal grain size. Especially, with regard to this method, there is a disclosure by Matsumura el al, which discloses its basic concept and theoretical verification in the article entitled "Preparation of Ultra-Large Grain Silicon Thin Film by Excimer-Laser" (Surface Science Vol. 21, No. 5, pp. 278-287, 2000).

Referring to FIG. 9(a), a reference numeral 91 indicates an excimer laser, 92 an emitted laser beam, 93 a beam intensity conversion optical system for converting laser beam intensity (dimension), 94 and 95 a phase shifter, 96 an amorphous substrate, and 97 a non-single crystal semiconductor layer. In FIG. 9(b), 98 indicates a start point of crystal growth, and 99 a single crystal grain.

As described in connection with the first prior art, with recent further technical progress related to the thin film formation on the glass substrate, it becomes practically possible to produce a thin film of which the mobility is about 100 m²/V○sec. Accordingly, it becomes possible to integrate the thin film transistor for a driving circuit and the thin film transistor for the pixel use on an identical glass substrate. In order to systemize the liquid crystal display and so forth, however, it is still requested to find other materials more suitable for the thin film transistor showing high performance and less dispersed characteristics. The second prior art shown in FIG. 9 shows a technique in compliance with the above request. That is, it is a technique for controlling the crystal grain size (to the extent of 5 μm) as well as the position of the crystal grain boundary. In this example, the beam 92 emitted from the excimer laser 91 is basically used as the light source as it is. If, however, the light intensity is not obtained sufficiently, the beam form is converted by the beam intensity conversion optical system 93 (described in detail referring to FIG. 10, later) and this converted beam is used. The most important point of this technique is the point that the light intensity is two-dimensionally modulated by means of two phase shifters 94 and 95 arranged to take a position perpendicular to each other. That is, the phase shifter 94 carries out the comparatively soft modulation (10 μm pitch) in the direction of an arrow A (the scanning direction of the glass substrate) in FIG. 9(a) while the phase shifter 95 performs the modulation (d=20 μm: a now actually proved value) in the direction of an arrow B (perpendicular to the scanning direction of the glass substrate). With combination of these modulations, the start point 98 of the crystal growth is produced while the crystal lateral growth is induced in the arrow "A" direction as shown in FIG. 9(b) (described in detail referring to FIG. 11, later).

Referring to FIG. 10, a reference numeral 92 indicates a beam emitted from the excimer laser, 93 a beam intensity conversion optical system and 100 a mask (diaphragm).

As already described, the laser beam 92 emitted from the excimer laser has a rectangular form of 2 cm×1 cm and also has a considerably good uniformity comparing with those which are emitted from a solid-state laser. As shown in FIG. 10, however, it is observed that the light intensity slowly goes down in the vicinity of the edge. In the second prior art, since two phase sifters 94 and 95 are used and the spatial coherence of the beam is required, it is needed to use such an optical system as uses a single lens or combination thereof as shown in FIG. 9. In order to convert the light irradiation intensity, the beam diameter is converted by using the beam intensity conversion optical system 93 as shown in FIG. 10. With this, the spatial coherence of the beam may be maintained, but homogeneity of the beam can not be improved. This is one problem of the technique as used in the second prior art. To solve the problem, there is provided a mask (diaphragm) 100 as shown in FIG. 10. The mask 100 might reduce the usage efficiency of the light, but it improves the homogeneity of the light.

Referring to FIG. 11(a), reference numerals 94 and 95 indicate the phase shifters, respectively, 96 an amorphous substrate, 97 a non-single crystal semiconductor layer, and 90 an excimer laser light. Referring to FIG. 11(b), a reference numeral 98 indicates the start point of the crystal growth and 99 a single crystal grain.

It has been described that the most important point of the second prior art is the point that the light intensity is two-dimensionally modulated. As shown in 11(a), the phase shifter 94 (Y-shifter) can modulates the excimer laser light 90 to cause the light intensity modulation as shown by ↑ in FIG. 11(b) while the phase shifter 95 (X-shifter) can modulate the excimer laser light 90 to cause the light intensity modulation as shown by → in FIG. 11(b). If these two separate phase shifters are arranged to direct to the directions perpendicular to each other, it becomes possible to grow the single crystal grain 99 of the position control type as shown in FIG. 11(b).

As shown in FIGS. 9 to 11, however, the second prior art has the following defects, which are:

1) As the light irradiation intensity on the substrate is varied by means of the phase shifters 94 and 95 capable of changing the phase of at least a part of the light with reference to a predetermined design of light irradiation intensity, there might be obtained the lateral crystal growth to the extent of about 5 to 10 μm. In this case, however, as it never fails to happen that some regions are left without being crystallized in the form of a single crystal, the complete high density crystal would not be obtained.

2) As the phase shifters 94 and 95 are used, it is required for the irradiation light to be of coherence and also, it is needed for the laser to emit parallel beams. The excimer laser capable of supplying a high-power now on market has an angle of divergence and is in the trade-off relation with regard to the relation between the positional accuracy and the lateral growth length. In addition, as the excimer laser handles a parallel beam system, the homogeneity of the beam amplitude depends on the amplitude intensity distribution of the beam immediately after emitted from the laser cavity resonator.

Because of this, the problems to be solved still remain with regard to the positional accuracy, the high density crystallization, and so forth in the region to be crystallized, and the trade-off relation comes to occur between the homogeneity in the laser irradiation region and the irradiation area. Thus, the practical use of the second prior art might invite a new problem in view of the productivity.

Accordingly, an object of the invention is to provide a method for forming a semiconductor thin film having excellent crystallinity on a base layer made of an insulating material and also to provide apparatus capable of performing the method.

SUMMARY OF THE INVENTION

In order to solve the above-mentioned problems, the invention takes constitutions as recited in the scope of claim for patent as per attached to this specification. That is:

According to the recitation of claim 1, there is provided a method for forming a semiconductor thin film of the class wherein a non-single crystal semiconductor layer is formed on a base layer made of an insulating material; the non-single crystal semiconductor layer is irradiated by light; and the light is relatively moved to the base layer, thereby crystallizing the non-single crystal semiconductor layer, the method including the steps of homogenizing the intensity distribution of the light; carrying out the amplitude modulation such that the amplitude of the light of which the intensity distribution is homogenized, is increased in the direction of the relative motion of the light to the base layer; projecting the amplitude-modulated light on the non-single crystal semiconductor layer formed on the base layer; providing a low temperature point in the irradiated surface of the non-single crystal semiconductor layer and generating a start point of the crystal growth; and forming a single crystal region along the direction of the relative motion of the light to the base layer.

Furthermore, according to the recitation of claim 2, there is provided a method for forming a semiconductor thin film of the class wherein a non-single crystal semiconductor layer is formed on a base layer made of an insulating material; the non-single crystal semiconductor layer is irradiated by light; and the light is relatively moved to the base layer, thereby crystallizing the non-single crystal semiconductor layer, the method including the steps of homogenizing the intensity distribution of the light; carrying out the amplitude modulation such that the amplitude of the light of which the intensity distribution is homogenized, is increased in the direction of the relative motion of the light to the base layer; providing a low temperature point in the light irradiated surface and generating a start point of the crystal growth; and forming a single crystal region along the direction of the relative motion of the light to the base layer.

Still further, according to the recitation of claim 3 and 4, in a method for forming a semiconductor thin film as recited in respectively claim 1 and 2, the light and the base layer are relatively moved at a pitch and the preceding first shot is overlapped in part with the second shot following the first shot, thereby forming the ribbon-shaped single crystal region.

Still further, according to the recitation in claim 5, there is provided apparatus for forming a semiconductor thin film of the class wherein a non-single crystal semiconductor layer is formed on a base layer made of an insulating material; the non-single crystal semiconductor layer is irradiated by light; and the light is relatively moved to the base layer, thereby crystallizing the non-single crystal semiconductor layer, the apparatus including a light source emitting the light; a homogenizer for homogenizing the intensity distribution of the light emitted from the light source; an amplitude-modulation means for performing the amplitude modulation such that the amplitude of the light of which the intensity distribution is homogenized, is increased in the direction of the relative motion of the light to the base layer; a light projection optical system for projecting the light that is amplitude-modulated by the amplitude-modulation means on the non-single crystal semiconductor layer formed on the base layer; means for providing a low temperature point in the surface irradiated by the light; and means for relatively moving the light to the base layer.

According to the reaction of claim 6, in apparatus for forming a semiconductor thin film as recited in claim 5, the amplitude-modulation means is a light absorption mask.

According to the recitation of claim 7, in apparatus for forming a semiconductor thin film as recited in claim 5, the means for providing a low temperature point is a phase shifter.

According to the recitation of claim 8, in apparatus for forming a semiconductor thin film as recited in claim 5, the means for providing a low temperature point is a mask having a light absorption dot.

According to the recitation of claim 9, there is provided apparatus for forming a semiconductor thin film of the class wherein a non-single crystal semiconductor layer is formed on a base layer made of an insulating material; the non-single crystal semiconductor layer is irradiated by light; and the light and the base layer are relatively moved each other, thereby crystallizing the non-single crystal semiconductor layer, the apparatus including a light source emitting the light; a homogenizer for homogenizing the intensity distribution of the light emitted from the light source; an amplitude-modulation means for performing the amplitude modulation such that the amplitude of the light of which the intensity distribution is homogenized by the homogenizer, is increased in the direction of the relative motion of the light to the base layer; means for providing a low temperature point in the face irradiated by the light; and means for relatively moving the light to the base layer.

According to the recitation of claim 10, in apparatus for forming a semiconductor thin film as recited in claim 9, means serving as both the amplitude modulation means and the means for providing the low temperature point is a phase shifter having light absorption dots.

According to the recitation of claim 11 and 12, apparatus for forming a semiconductor thin film as recited in respectively claim 5 and 9 further including an alignment means for aligning the amplitude modulation means and means for providing a low temperature point.

According to the recitation of claim 13 and 14, in apparatus for forming a semiconductor thin film as recited in respectively claim 11 and 12, the alignment means is an aligner using the laser beam for alignment as well as an alignment mark.

BRIEF DESCRIPTION OF THE DRAWINGS

FIG. 1(a) a diagram for explaining a method and apparatus for forming a semiconductor thin film according to the first embodiment of the invention while FIG. 1(b) is a diagram enlarging in detail a part of FIG. 1(a).

FIG. 2(a) is a diagram showing a more concrete constitution of the first embodiment as shown in FIG. 1(a) while FIG. 2(b) is a graph showing a relation between a wavelength at an absorption edge and a film composition of Si (O, N) system and Si (O, C) system for use in making an amplitude modulation mask.

FIG. 3(a) is a diagram for explaining the second embodiment of the invention while FIG. 3(b) is a graph showing a relation between a wavelength at an absorption edge and a film composition of Si (O, N) system and Si (O, C) system for use in making an amplitude modulation mask.

FIG. 4(a) is a diagram for explaining the third embodiment of the invention while FIG. 4(b) is a graph showing a relation between a wavelength at an absorption edge and a film composition of Si (O, N) system and Si (O, C) system for use in making a phase shifter.

FIG. 5(a) is a diagram for explaining the fourth embodiment of the invention while FIG. 5(b) is a diagram enlarging in detail a part of FIG. 5(a).

FIG. 9(a) is a diagram for describing the first prior art while FIG. 9(b) is a diagram enlarging in detail a part of FIG. 9(a).

DETAILED DESCRIPTION OF THE PREFERRED EMBODIMENTS

Figure 1:
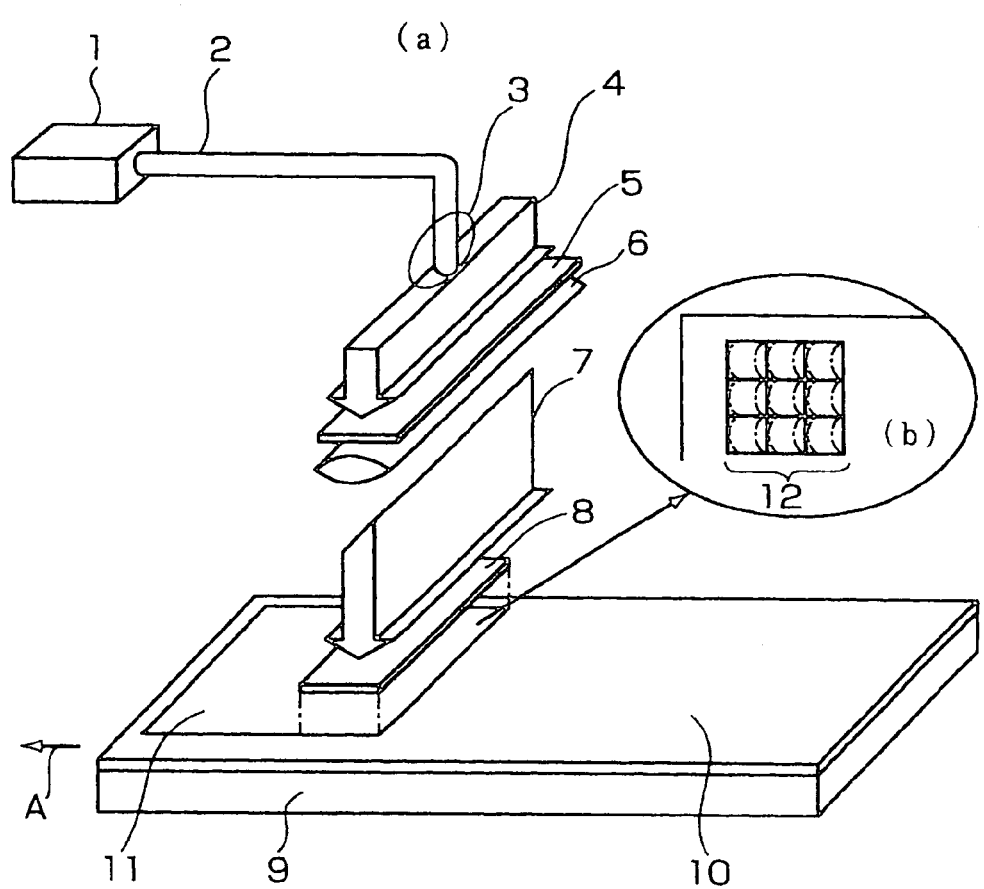

The invention will now be described in detail with reference to the accompanying drawings, wherein constituents of the invention having like function and structure will be denoted with like reference numerals and characters in order to avoid the redundant repetitive description.

First Embodiment

Referring now to FIG. 1(a), a reference numeral 1 indicates a light source such as an excimer laser, 2 an emitted laser beam, 3 a laser homogenizer, 4 a line beam (homogenized laser light), 5 an amplitude modulation mask such as a light absorption mask, 6 an optical system which is made up of a cylindrical lens and so on, and projects the light such that a predetermined irradiation energy can be obtained on the objective surface to be irradiated, 7 a homogenized, amplitude-modulated, and projected line beam, 8 a phase shifter as means for providing a low temperature point in the light irradiation surface, 9 an amorphous substrate such as a glass substrate, 10 a non-single crystal semiconductor layer for instance made of silicon (Si), and 11 a crystallized semiconductor layer. In FIG. 1(b), a reference numeral 12 indicates a single crystal array.

Figure 9:
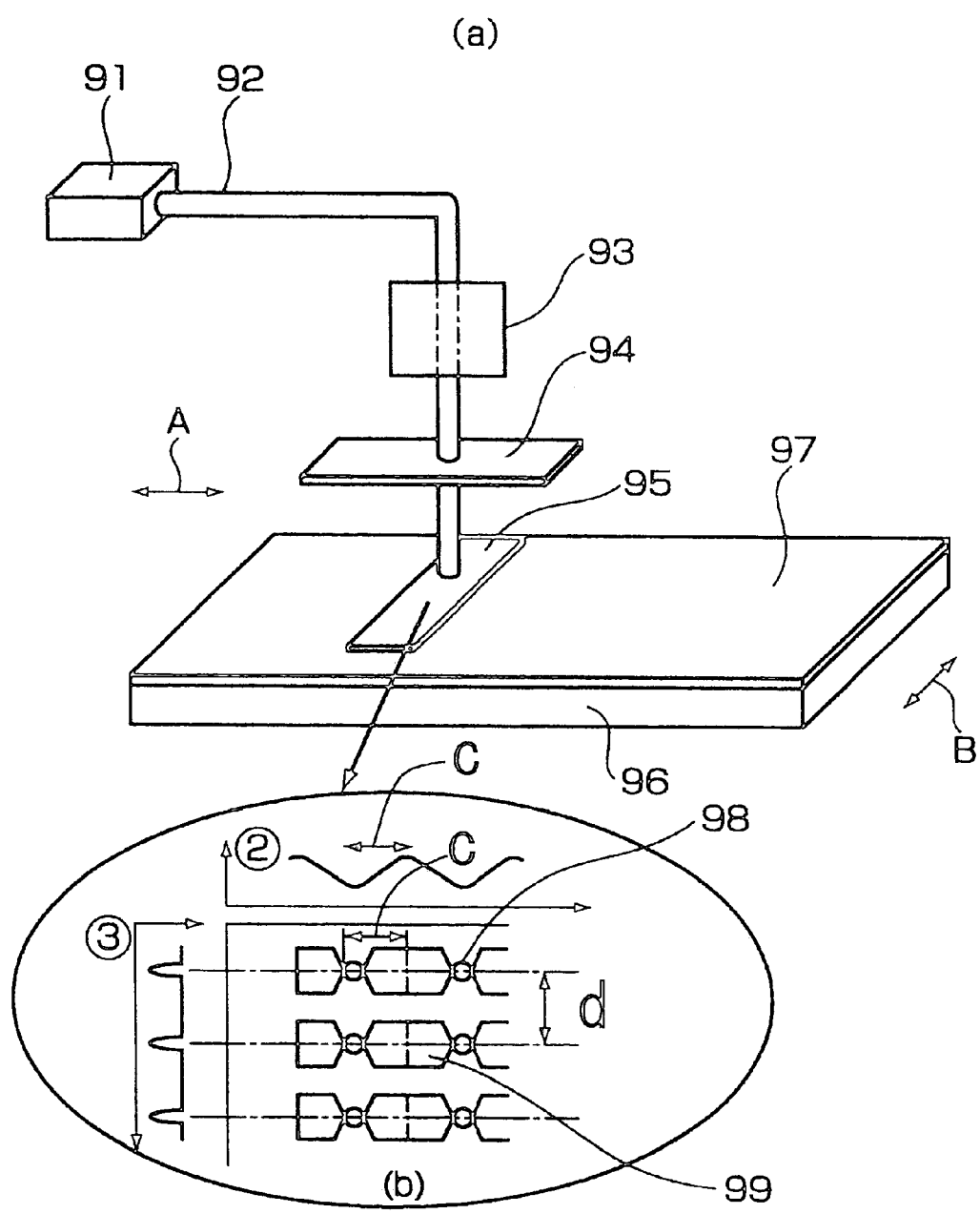
Figure 10:
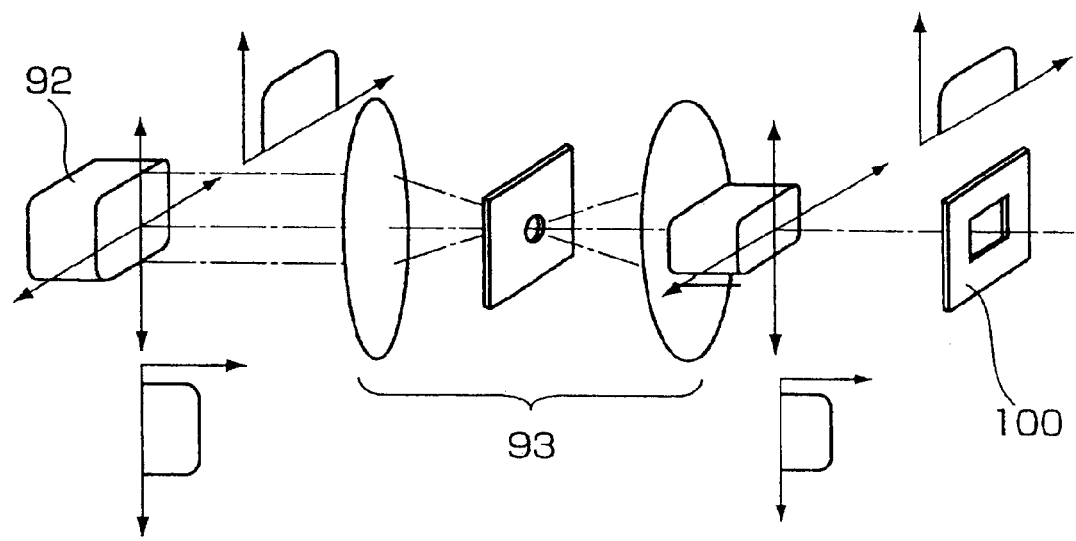
FIG. 10 is a diagram showing an optical system for use in laser projection as used in the second prior art.
Figure 11:
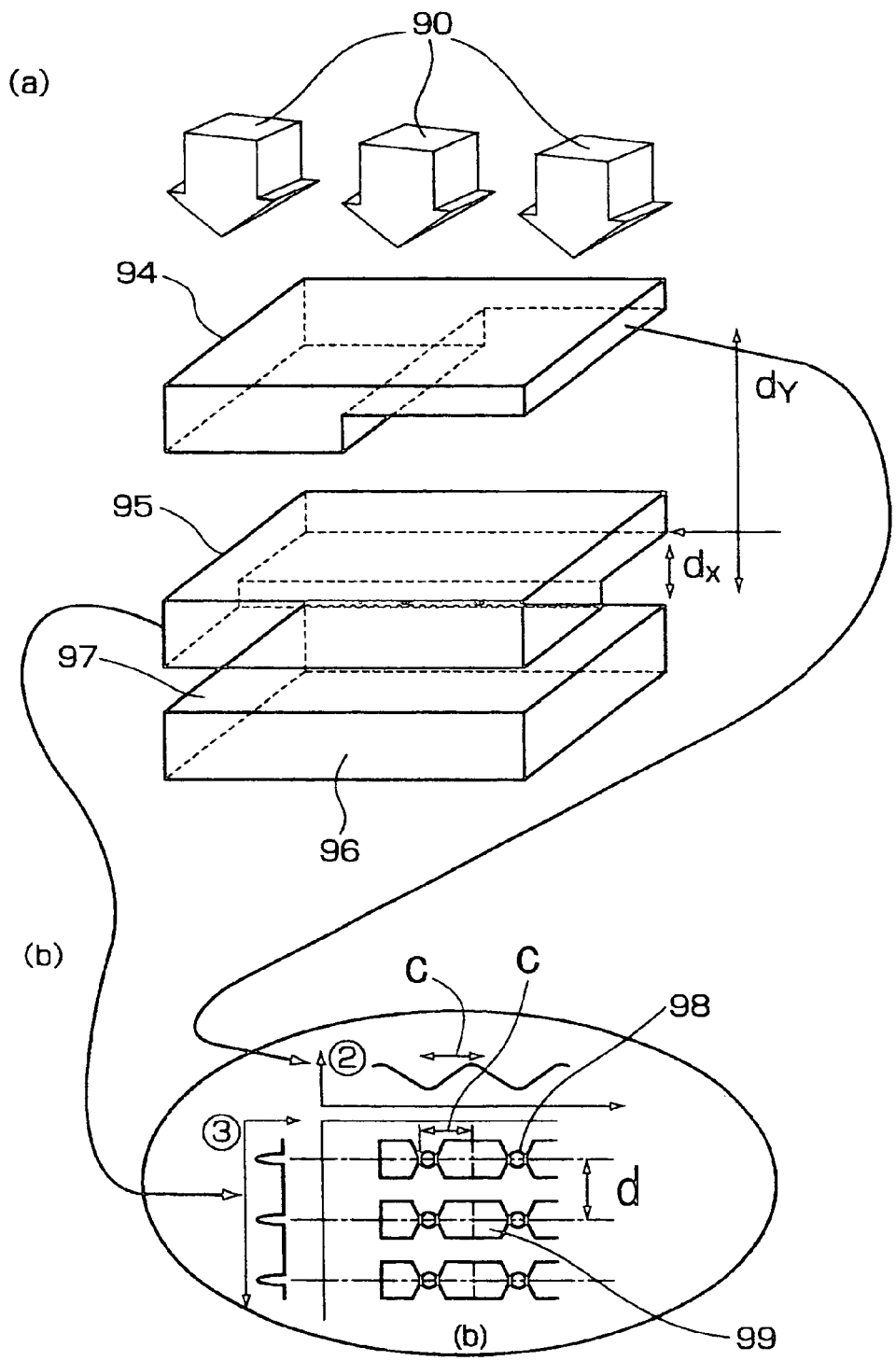
FIG. 11(a) a diagram showing an optical system for use in laser projection as used in the second prior art while 11(b) is a diagram enlarging in detail a part of FIG. 11(a).

In the second prior art, as two phase shifters 94 and 95 (FIGS. 9(a) and 11(a)) are used, the spatial coherence of the beam is required. Accordingly, the beam is basically put under the control by the homogeneity of the beam from the primary light source. Consequently, there is not observed any remarkable improvement in the homogeneity of the eventual beam. Accordingly, the second prior art only results in the low light usage efficiency as well as in the lowered productivity.

Figure 7:
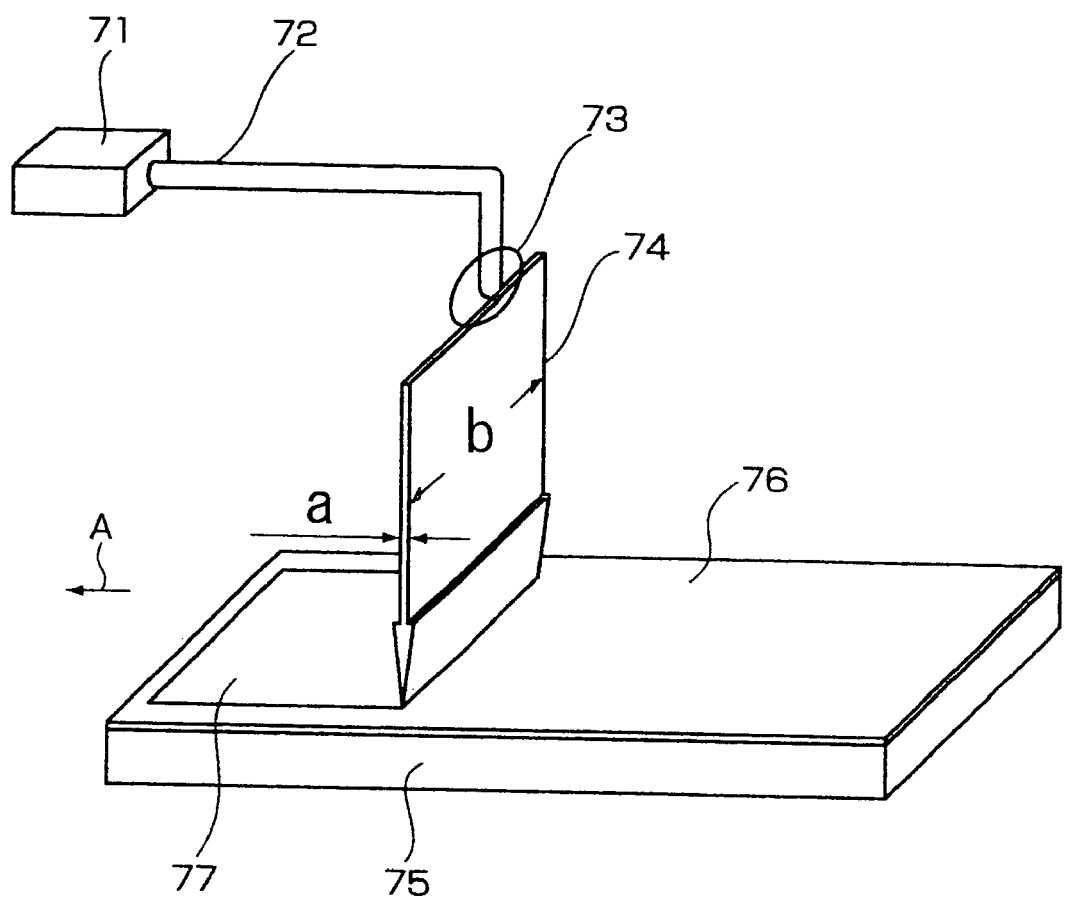
FIG. 7 is a diagram for describing the first prior art.
Figure 8:
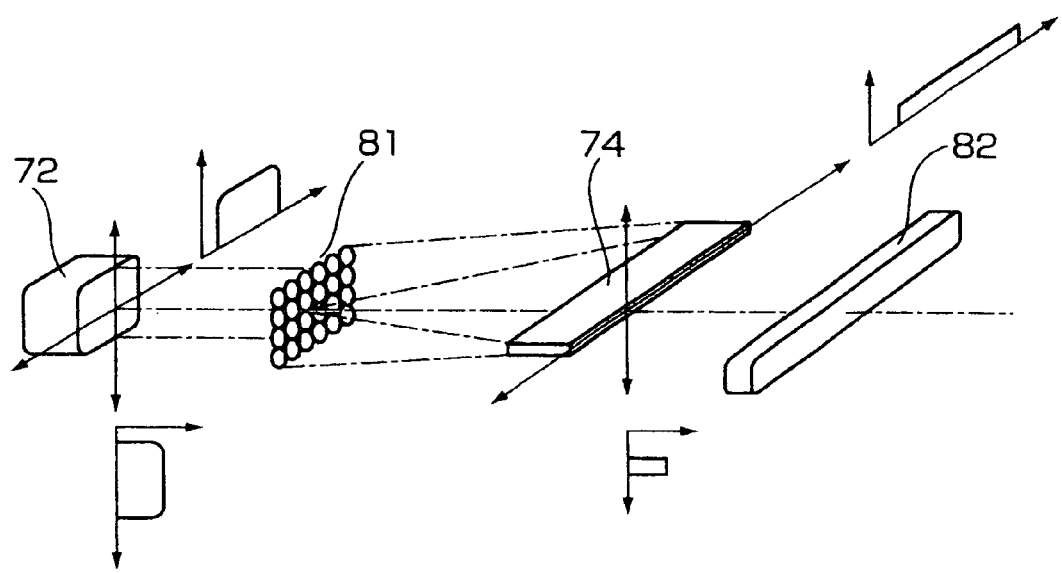
FIG. 8 is a diagram showing an optical system as used in the first prior art as shown in FIG. 7.

Then, in the first embodiment, the formation and homogenization of the beam emitted from the excimer laser 1 as the primary light source is attempted by using the same homogenizer 3 as that which is used in the first prior art (73 in FIG. 7). After this, the beam is made to pass through the amplitude modulation mask 5 as the amplitude modulation means, the light projection optical system 6 which is made up of a cylindrical lens and so on, and projects the beam such that a predetermined irradiation energy can be obtained, and the phase shifter 8 controlling the start point of the crystal growth. With this, the same crystal growth as that which is seen in the second prior art is realized without depending on the spatial coherence of the beam from the excimer laser 1. According to the first embodiment, therefore, there is brought about such a large effect that the light usage efficiency is maintained and the single crystal array 12 can be formed according to the shape of the line beams 4 and 7.

Figure 2:
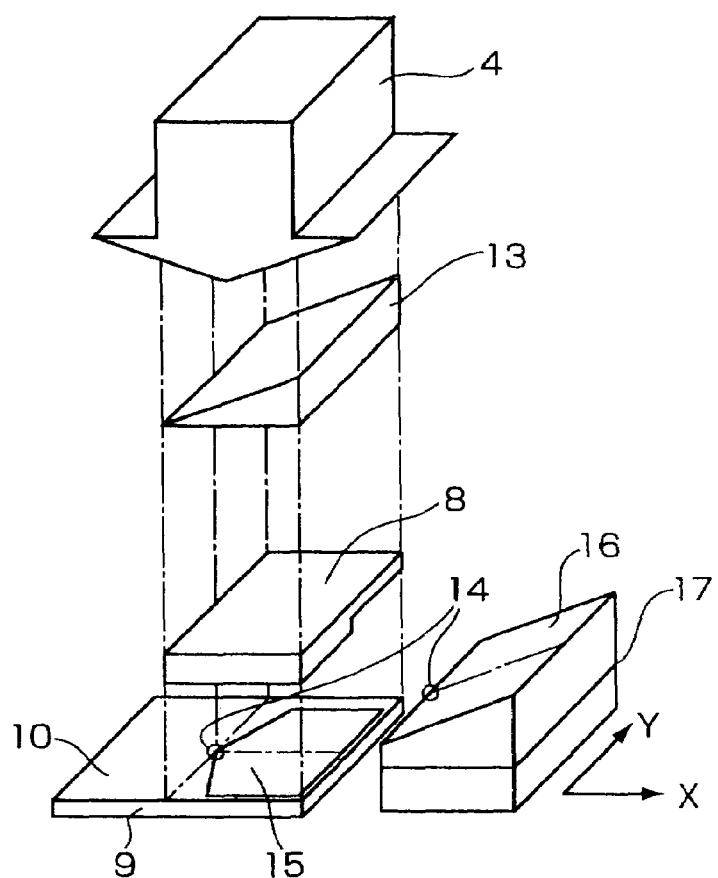
Figure 2:
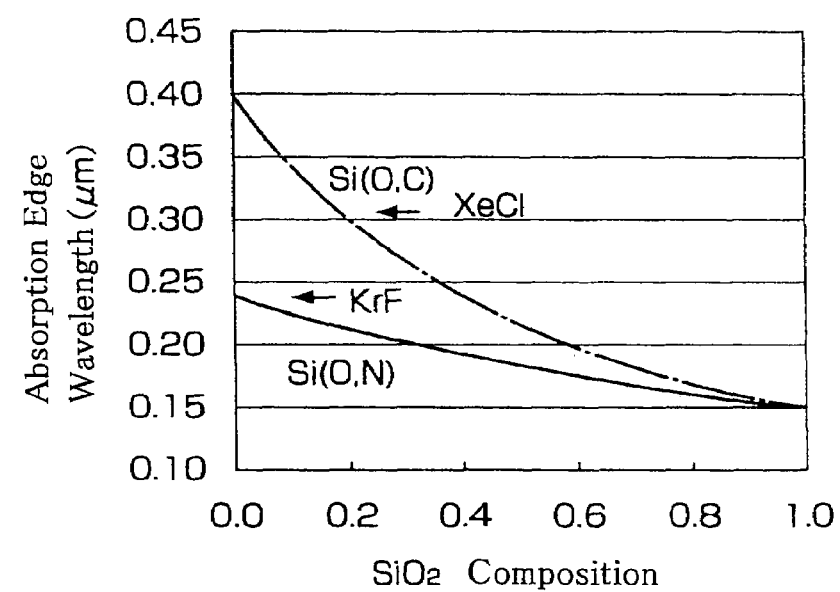

Referring to FIG. 2(a), a reference numeral 4 indicates a line beam (homogenized laser light), 13 a light intensity distribution after amplitude modulation, 8 a phase shifter, 9 an amorphous substrate, 10 a non-single crystal semiconductor layer, 14 a start point of the crystal growth (start point of crystallization), 15 a single crystal region, 16 a temperature distribution at the time of laser irradiation, and 17 a melting point.

In FIG. 2(a), however, there are not shown the amplitude modulation mask 5 and the light projection optical system 6.

For instance, as shown in FIG. 2(b), in case of the krypton fluoride (KrF) laser, the amplitude modulation mask 5 can be made by distributing the thin film made of a material belonging to the Si (O, N) system on the surface of the base layer. Similarly, in case of a xenon chloride (XeCl) laser, as shown in FIG. 2(b), the amplitude modulation mask 5 can be made by distributing the thin film made of a material belonging to the Si (O, C) system or Si (O, N, C) system on the surface of the base layer.

Furthermore, according to the first embodiment, the phase shifter 8 can be used as means for controlling (generating) the start point 14 of crystallization. Essentially, the phase shifter is to be used on the assumption that the light source emits the coherent light. However, as shown by the invention, even if the light is not coherent, the boundary portion having a different phase is able to always take a minimum value as to the light intensity. Consequently, as will be seen from the temperature distribution 16 at the time of laser irradiation as shown in FIG. 2(a), a portion having a temperature lower than anywhere surrounding it is generated at the center portion in the Y-direction and the origin in the X-direction. As a result, that portion becomes a start point of the crystal growth 14 as shown in FIG. 2(a).

Like this, in the first embodiment, as it is hard to handle the beam immediately after being emitted from the excimer laser 1 as it is, from the standpoint of consistency between the productivity and the homogeneity control, the beam having uniform amplitude is generated by the area division and mixture of the beam. On this occasion, as the beam loses its coherence, the irradiation intensity on the amorphous substrate 9 is modulated by the amplitude modulation using the amplitude modulation mask 5. With this concept, there can be realized such a lateral crystal growth that continues to grow up while it reaches a length of about 5 to 10 μm.

In the afore-mentioned second prior art, an amorphous silicon film to be crystallized has a thickness of usually 100 nm or less, preferably about 50 nm. When producing the homogenized laser beam having a predetermined section form and a width of about 20 cm by using a high-power excimer laser, as irradiation energy of about 400 mJ/cm$^2$ become usually necessary, it is possible to scan at a speed of about 5 mm/sec. In case of a glass substrate having a size of 55 cm×65 cm which is usually used for the liquid crystal display, the amorphous silicon thin film prepared on the glass substrate can be crystallized over the entire face thereof within about 5 minutes. The amorphous silicon film used in the first embodiment has a thickness of 50 nm to 300 nm, preferably 200 nm or so. The irradiation energy as required in the first embodiment is 2 or 3 times that which is required in the first prior art as mention before. However, as the optical system as used in the first embodiment is two dimensionally designed, it is possible to form a single crystal thin film over the entire face of the glass substrate of 55 cm×65 cm size at a speed of ⅓ or still slower than that which is used in the first prior art.

A very difficult technique is required in order to uniformly form the single crystal thin film covering the entire surface of the amorphous substrate. According to the invention, however, it becomes possible to form a single crystal region in an arbitrary position on an amorphous substrate, especially on a glass substrate, at an arbitrary pitch. Therefore, the invention can be further developed as a fundamental technique for forming a single crystal array adaptable to the performance of the semiconductor thin film which is determined based on the requested circuit specification and the design rule as well.

The method for forming a semiconductor thin film according to the first embodiment corresponds to claim 1 of the scope of claim for patent of the invention. That is, the method for forming a semiconductor thin film of the class wherein a non-single crystal semiconductor layer (10) is formed on a base layer made of an insulating material (amorphous substrate 9); the non-single crystal semiconductor layer is irradiated by the laser light (emitted from an excimer laser 1); and the laser light and the base layer are relatively moved each other, thereby crystallizing the non-single crystal semiconductor layer, the method including the steps of homogenizing the intensity distribution of the light; carrying out the amplitude modulation (by using a amplitude- modulation mask 5) such that the amplitude of the light, of which the intensity distribution is homogenized, is increased in the direction of the relative motion of the light to the base layer; projecting the amplitude modulated light on the non-single crystal semiconductor layer formed on the base layer (by using the light projection optical system 6); providing a low temperature point in the above irradiated face (by using a phase shifter 8) and generating a start point (14) of the crystal growth; and forming a single crystal region (15) along the direction of the relative motion of the laser light to the base layer.

Furthermore, apparatus for forming a semiconductor thin film according to the first embodiment corresponds to claim 5 of the scope of claim for patent of the invention. That is, apparatus for forming a semiconductor thin film of the class wherein a non-single crystal semiconductor layer is formed on a base layer made of an insulating material; the non-single crystal semiconductor layer is irradiated by the laser light; and the laser light and the base layer are relatively moved each other, thereby crystallizing the non-single crystal semiconductor layer, the apparatus including a light source (excimer laser 1) emitting the light; a homogenizer (3) for homogenizing the intensity distribution of the light emitted from the light source; an amplitude-modulation means (amplitude-modulation mask) such that the amplitude of the light of which the intensity distribution is homogenized, is increased in the direction of the relative motion of the light to the base layer; a light projection optical system (6) for projecting the light that is amplitude-modulated by the amplitude-modulation means on the non-single crystal semiconductor layer formed on the base layer; means (phase shifter 8) for providing a low temperature point in the above irradiated face; and means for relatively moving the light and the base layer (substrate stage capable of being scanned in the X-Y directions or means for scanning the light (these are not shown)).

Still further, apparatus for forming a semiconductor thin film according to the first embodiment corresponds to claim 6, wherein the amplitude-modulation means (amplitude modulation mask 5) is a light absorption mask.

Still further, apparatus for forming a semiconductor thin film according to the first embodiment corresponds to claim 7, wherein means for providing a low temperature point is a phase shifter (8).

Still further, apparatus for forming a semiconductor thin film according to the first embodiment corresponds to claim 11 and 12, wherein there is further included an alignment means (not shown as it is publicly known) for aligning the above amplitude modulation means (amplitude modulation mask 5) and the above means for providing a low temperature point (phase shifter 8).

Still further, apparatus for forming a semiconductor thin film according to the first embodiment corresponds to claim 13 and 14, wherein the above alignment means uses the laser beam for use in alignment as well as an alignment mark (not shown as they are publicly known).

Second Embodiment

Figure 3:
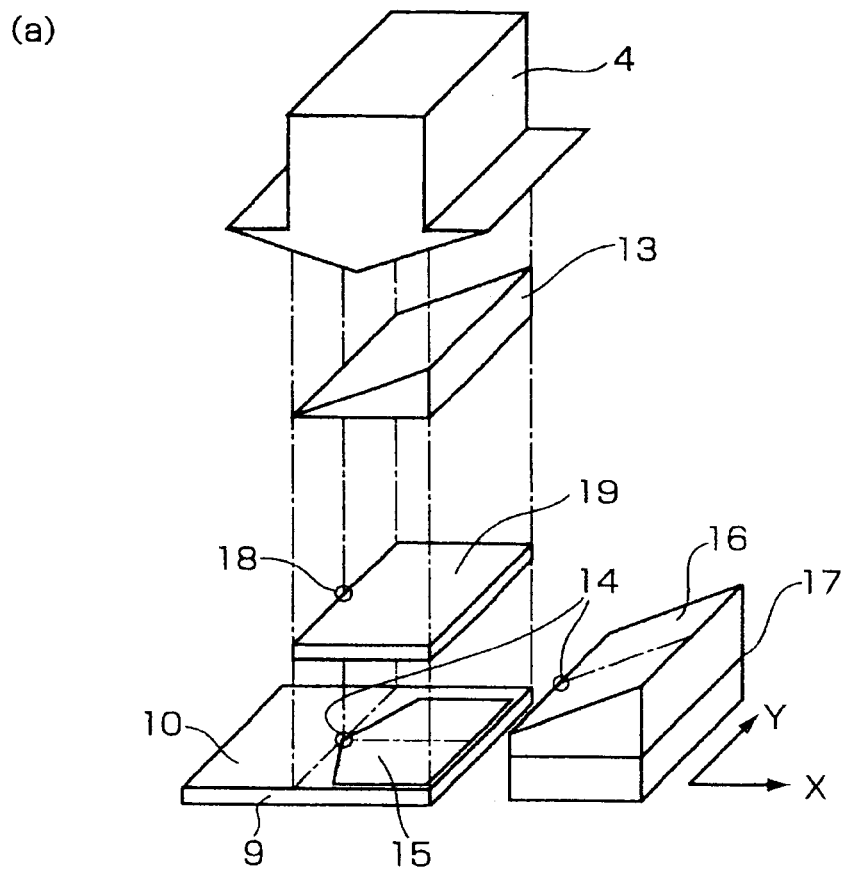
Figure 3:
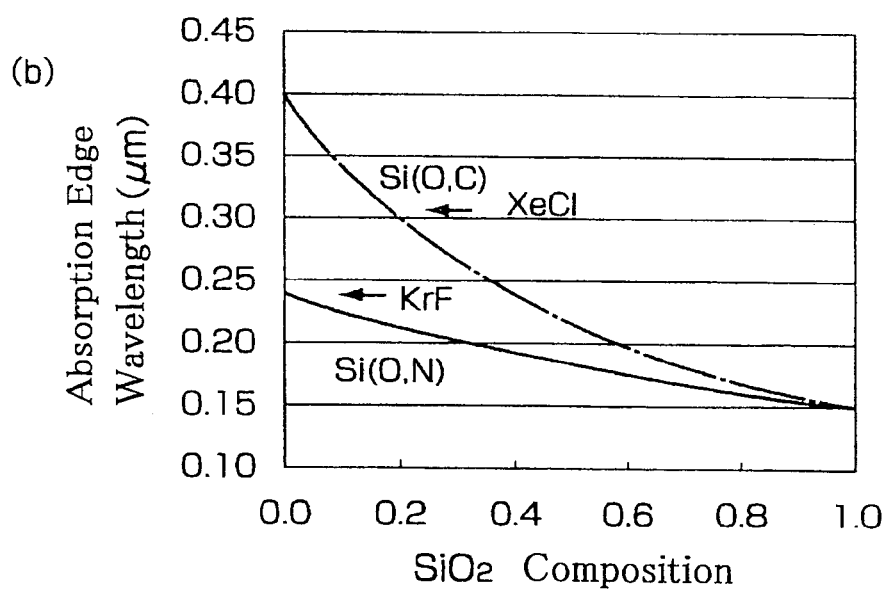

Referring to FIGS. 3(a) and 3(b), a reference numeral 18 indicates a light absorption dot, and 19 a mask having a light absorption dot 18.

FIG. 3(a) indicates an example of the second embodiment wherein the mask 19 having the light absorption dot 18 is provided as the means for generating the start point of the crystal growth 14 (see FIG. 2(a)) at the position identical to that of the phase shifter 8 of the first embodiment. This mask 19 having the light absorption dot 18 also can be made as shown in FIG. 3(b). For instance, in case of the KrF laser, it can be made by using a film made of a material belonging to Si(O, N) system and in case of the XeCl laser, it can be made by using a film made of a material belonging to Si(O, N, C) system.

With the temperature distribution 16 at the time of laser irradiation similar to that which is shown in FIG. 2(a), a portion having a temperature lower than the ambient temperature is generated to be located at the center portion in the Y-direction and the origin in the X-direction. As a result, there is generated the start point of the crystal growth 14 as shown in FIG. 3(a), and the lateral crystal growth of about 5 to 10 μm is realized similar to the first embodiment.

The apparatus for forming a semiconductor thin film according to the second embodiment corresponds to claim 8, wherein means for providing the above low temperature portion is a mask (19) having a light absorption dot (18).

Third Embodiment

Figure 4:
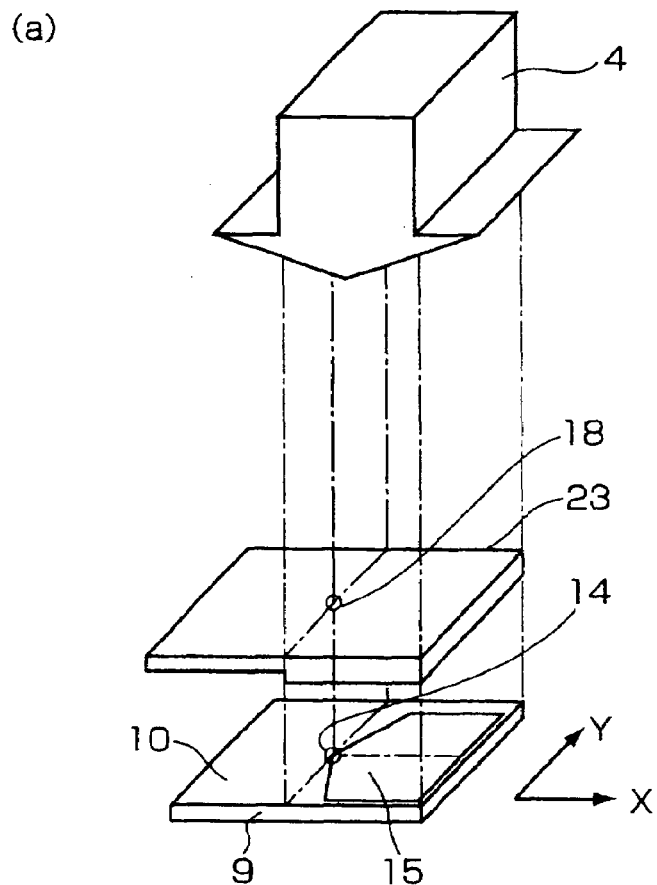
Figure 4:
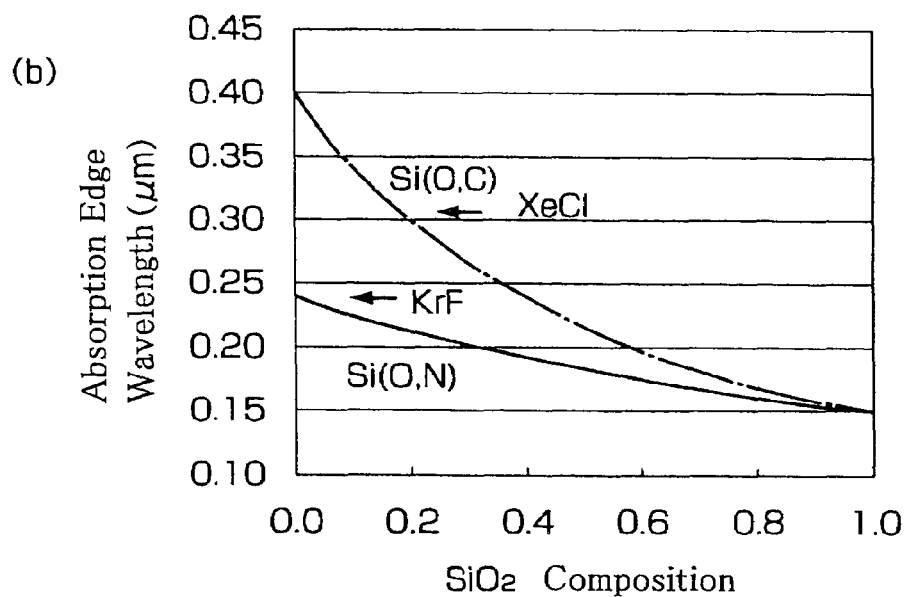

In the third embodiment of the invention, instead of removing the amplitude modulation mask 5 from the constitution as shown in FIG. 1, a mask provided with the light absorption dot 18 (FIG. 3(a)) is arranged on or in the vicinity of the stepped portion of a phase shifter 23 as shown in FIG. 4(a), which is equivalent to that which is obtained by turning the phase shifter 8 (FIG. 2(a)) by a right angle. The light absorption dot being made by using a film made of a material belonging to Si(O, C, N) system in case of the KrF laser. With the above constitution, it is possible to perform the same crystal growth as attained in the first and second embodiments. It seems to be usually said that the excimer laser light as homogenized by the homogenizer can be independent from the light-intensity modulation using the phase shifter. According to our experiments, however, it is found that if the glass substrate 9 is arranged at a distance of 1 mm or less from the phase shifter 23 controlling the above lateral crystal growth, there comes out on the glass substrate 9 a temperature distribution similar to that (FIG. 3(a), 16) which appears at the time of laser irradiation.

The method for forming a semiconductor thin film according to the third embodiment corresponds to claim 2 of the scope of claim for patent of the invention. That is, the method for forming a semiconductor thin film of the class wherein a non-single crystal semiconductor layer (10) is formed on a base layer made of an insulating material (amorphous substrate 9); the non-single crystal semiconductor layer is irradiated by laser light (emitted from an excimer laser 1); and the laser light and the base layer are relatively moved each other, thereby crystallizing the non-single crystal semiconductor layer, the method including the steps of homogenizing the intensity distribution of the above light; carrying out the amplitude modulation (by using a phase shifter 23) such that the amplitude of the light, of which the intensity distribution is homogenized, is increased in the direction of the relative motion of the light to the base layer; providing a low temperature point in the above irradiated surface (by a light absorption dot 18) and generating a start point (14) of the crystal growth; and forming a single crystal region (15) along the direction of the relative motion of the light to the base layer.

Furthermore, apparatus for forming a semiconductor thin film according to the third embodiment corresponds to claim 9 of the scope of claim for patent of the invention. That is, apparatus for forming a semiconductor thin film of the class wherein a non-single crystal semiconductor layer is formed on a base layer made of an insulating material; the non-single crystal semiconductor layer is irradiated by light; and the light is relatively moved to the bas layer, thereby crystallizing the non-single crystal semiconductor layer, the apparatus including a light source (excimer laser 1) emitting the light; a homogenizer (3) for homogenizing the intensity distribution of the light emitted from the light source; an amplitude-modulation means (phase shifter 23) for carrying out amplitude-modulation such that the amplitude of the light of which the intensity distribution is homogenized by the homogenizer, is increased in the direction of the relative motion of the light to the base layer; means (light absorption dot 18) for providing a low temperature point in the above irradiated face; and means for relatively moving the light and the base layer (substrate stage capable of being scanned in the X-Y directions or light scanning means (these are not shown)). That is, in the third embodiment, it is unnecessary to prepare a light projection optical system (6) for projecting the light that is amplitude-modulated by the amplitude modulation means to the non-signal crystal layer formed on the base layer.

Still further, apparatus for forming a semiconductor thin film according to the third embodiment corresponds to claim 10, wherein means for performing the amplitude modulation as well as for providing the low temperature point is constituted by the phase shifter (23).

Fourth Embodiment

Figure 5:
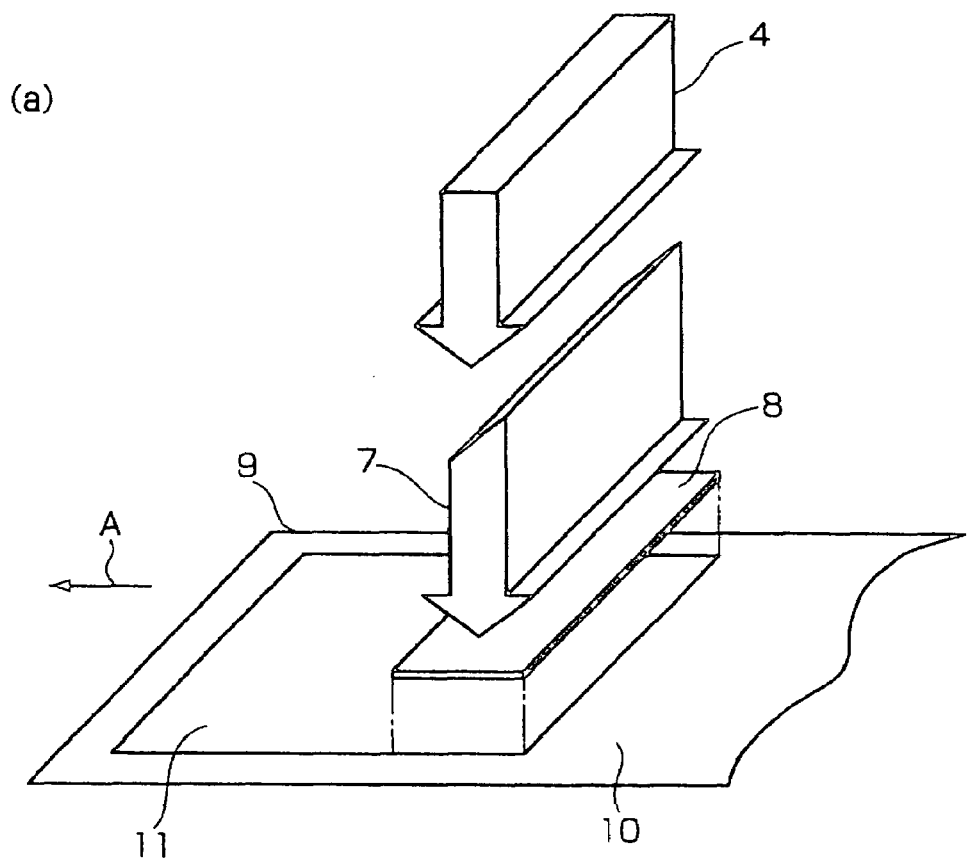
Figure 5:
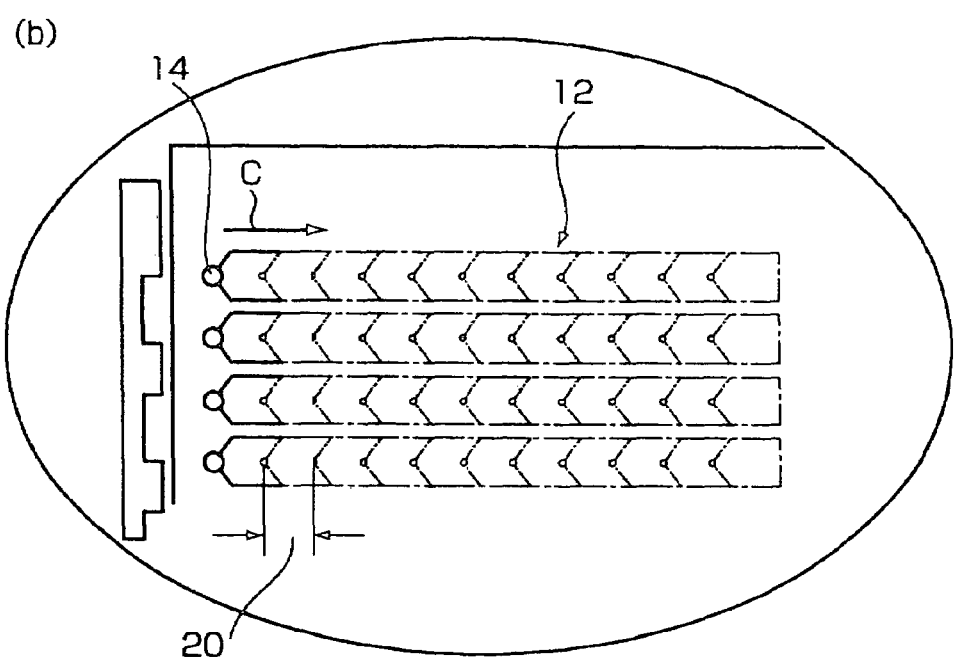

Referring to FIG. 5(a), a reference numeral 4 indicates a line beam (homogenized laser light), 7 a line beam that is amplitude-modulated and then projected, 8 a phase shifter, 9 an amorphous substrate, 10 a non-single crystal semiconductor, 11 a crystallized semiconductor, 20 a feed pitch of an amorphous substrate 9 (i.e. a substrate stage but not shown).

Also in FIG. 5(a), there are not shown the excimer laser 1, the emitted beam 2, the homogenizer 3, the amplitude modulation mask 5 formed of light absorption mask, and the light projection optical system 6. In FIG. 5(b), a reference numeral 12 indicate a single crystal array, 20 a feed pitch, and an arrow C the direction of lateral crystal growth.

The problems in the afore-mentioned second prior art are that the area occupancy rate of the crystallized region in the crystallized array is apt to become lower than that which is initially designed, and that as the start point of the crystal growth 98 can not help being always contiguous to the initial state under the crystallization for instance an amorphous silicon phase, a primary factor for facilitating the crystallization is dominated by the cooling process and sensitively depends on a very small quantity of impurities in the amorphous silicon phase and various states of the boundaries between the film and the substrate, thus being lacking in reproducibility of the good crystallized array.

Then, in the fourth embodiment, in order to obviate the problems as described above, there is prepared an apparatus like FIG. 5(a) having a stage feeding mechanism (not shown) wherein the feeding stage can be fed by a distance a little shorter than an expected lateral growth distance of the crystal. For instance, the amorphous substrate 9 can be fed at a pitch 20 of about 5 μm in the direction of the arrow A. With this method, the afore-mentioned area occupancy rate of the crystallized region is enhanced and the single crystal array 12 can be formed with improved reproducibility, although the crystallized region takes a form which might be called ribbon lines rather than an array.

Figure 6:
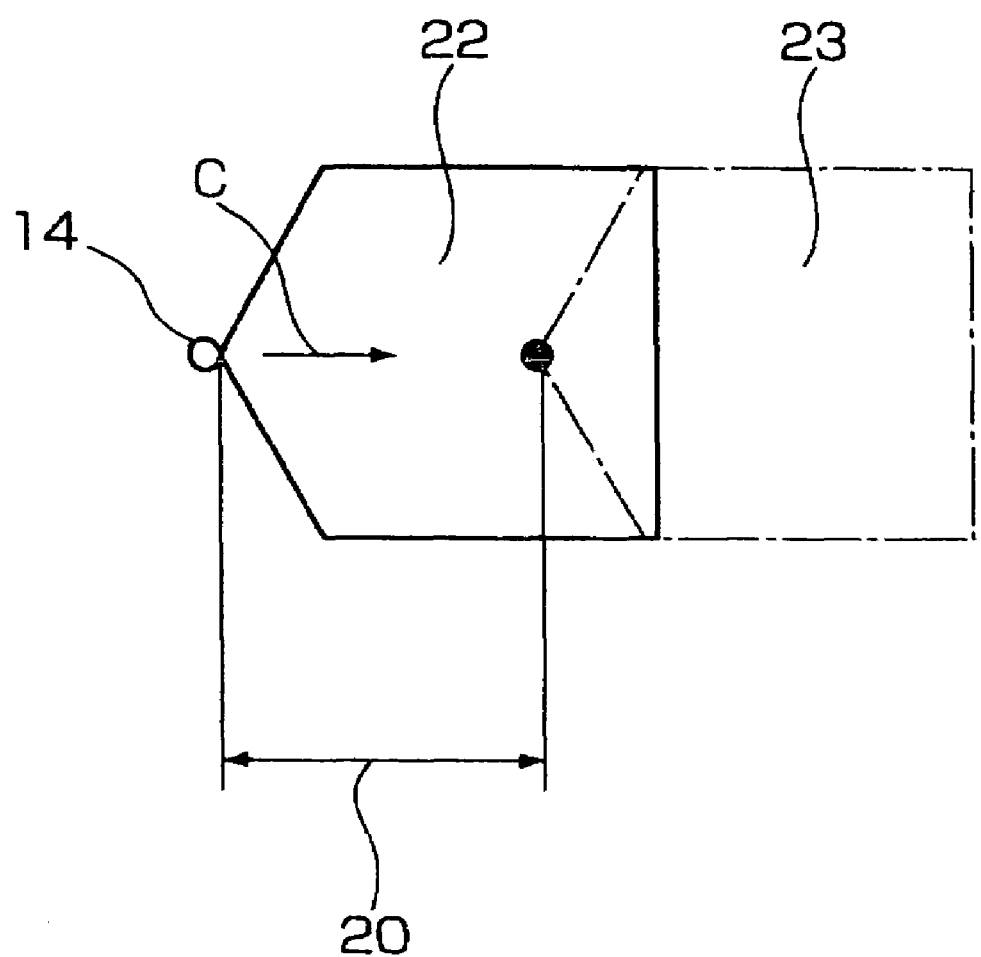
FIG. 6 is a diagram for describing more in detail the fourth embodiment of the invention.

Referring to FIG. 6, a reference numeral 21 indicates a primary shot (the first shot; single crystal grain) and 22 a next shot (the second shot).

For instance, in the crystallized initial film made of amorphous silicon, the single crystal grain obtained in the second prior art is the same single crystal grain that is obtained by the primary shot 21 as shown in FIG. 6. That is, the lateral crystal growth begins from the start point 14 of the crystal growth in the direction of an arrow C. However, this lateral crystal growth is almost dominated by the initial process of the crystallization. In this initial process, a core is formed at a certain probability during the cooling process and then, moves to the step of the lateral crystal growth. In the second prior art, the single crystal grain is formed by the above primary shot at respective independent probabilities. Consequently, the second prior art leaves still unsolved problems on the reproducibility and consistency in the core formation as well as in the lateral crystal growth following thereto.

On one hand, in the crystallization method according to the fourth embodiment of the invention as shown in FIG. 6, the crystallization is carried out such that the single crystal grain formed by the primary shot 21 is overlapped in part with the single crystal grain formed by the second shot 22, and further the gain by the second shot is overlapped in part with the next one (not shown)—and so forth. In the first shot 21, the primary factor i.e. the process of probability might strongly dominates the core generation and the lateral growth of the single crystal grain thereafter. In the next shot 22 and thereafter, the crystallized region is already made contiguous to the start point of the crystal growth 14. This means that a seed for crystal growth is already prepared and the crystal can be grown from the seed. Accordingly, the crystallization is dominated by the growth from the semi-equilibrium of melt-solid, thus the above-mentioned reproducibility and consistency being improved to a great extent.

Like this, in order to make the single crystallized region 15 have high density, if the concept of "the light source" as described in the first embodiment is used, the formation and the variation of the beam become possible, so that the ribbon-shaped single crystal region can be formed by applying the step-and-repeat method to the extent of the amplitude modulation mask 5, the phase shifter 8, and the length of the lateral growth.

Like this, the method for forming a semiconductor thin film according to the fourth embodiment corresponds to claim 3 and 4, wherein the light is relatively moved to the base layer at a pitch (feed pitch: 20) to the extent of a crystal growth distance, and the preceding first shot (21) is overlapped in part with the second shot (22) following the first shot, thereby forming the ribbon-shaped single crystal region.

While the invention has been concretely described based on some embodiments thereof, the invention is not limited to those embodiments. It will be apparent, however, that various changes and modifications can be made without departing from the gist of description with regard to those embodiments. For instance, in the first through the third embodiments, the amorphous substrate 9 like a glass substrate is used as a base layer made of an insulating material, but needless to say, the invention is not limited to this. For instance, it is possible to use a base layer made of various transparent or opaque insulating material such as ceramics, plastics, and so forth. Furthermore, the non-single crystal semiconductor layer provided on the above base layer may be an amorphous semiconductor layer, or a poly-crystal semiconductor layer made of a tremendous amount of very fine single crystals. Accordingly, it is possible to form the semiconductor thin film according to the invention by recrystallizing the above various semiconductor layers.

As has been described in the above, according to the invention, there becomes available a technique capable of forming a single crystal region on the amorphous substrate such a the glass substrate in an arbitrary position at a arbitrary pitch, and there is realized a fundamental technique capable of forming a single crystal array adaptable to the performance of the semiconductor thin film and the design rule which are determined in compliance with a requested circuit specification.

What is claimed is:

1. Apparatus for forming a semiconductor thin film of the class wherein a non-single crystal semiconductor layer is formed on a base layer made of an insulating material; said non-single crystal semiconductor layer is irradiated by light; and said light is relatively moved to said base layer, thereby crystallizing said non-single crystal semiconductor layer, the apparatus comprising:
   a light source emitting said light;
   a homogenizer for homogenizing the intensity distribution of said light emitted from said light source;
   an amplitude-modulation means for performing the amplitude modulation such that the amplitude of said light of which the intensity distribution is homogenized, is increased in the direction of the relative motion of said light to said base layer;
   a light projection optical system for projecting the light that is amplitude-modulated by said amplitude-modulation means on said non-single crystal semiconductor layer formed on said base layer;
   means for providing a low temperature point in the surface irradiated by said light; and
   means for relatively moving said light to said base layer.

2. Apparatus for forming a semiconductor thin film as claimed in claim 1, wherein said amplitude-modulation means comprises a light absorption mask.

3. Apparatus for forming a semiconductor thin film as claimed in claim 1, wherein said means for providing a low temperature point comprises a phase shifter.

4. Apparatus for forming a semiconductor thin film as claimed in claim 1, wherein said means for providing a low temperature point comprises a mask having a light absorption dot.

5. Apparatus for forming a semiconductor thin film of the class wherein a non-single crystal semiconductor layer is formed on a base layer made of an insulating material; said non-single crystal semiconductor layer is irradiated by the light; and said light is relatively moved to said base layer, thereby crystallizing said non-single crystal semiconductor layer, the apparatus comprising:
   a light source emitting said light;
   a homogenizer for homogenizing the intensity distribution of the light emitted from said light source;
   an amplitude-modulation means for performing the amplitude modulation such that the amplitude of said light, of which the intensity distribution is homogenized, is increased in the direction of the relative motion of said light to said base layer;
   means for providing a low temperature point in the surface irradiated by said light; and
   means for relatively moving said light to said base layer.

6. Apparatus for forming a semiconductor thin film as claimed in claim 5, wherein said amplitude-modulation means and said means for providing the low temperature point comprises a phase shifter having light absorption dot.

7. Apparatus for forming a semiconductor thin film as claimed in claim 1 further comprising an alignment means for aligning said amplitude-modulation means and said means for providing a low temperature point.

8. Apparatus for forming a semiconductor thin film as claimed in claim 5 further comprising an alignment means for aligning said amplitude-modulation means and said means for providing a low temperature point.

9. Apparatus for forming a semiconductor thin film as claimed in claim 7, wherein said alignment means comprises an aligner including a laser beam for alignment as well as an alignment mark.

10. Apparatus for forming a semiconductor thin film as claimed in claim 8, wherein said alignment means comprises an aligner including a laser beam for alignment, as well as an alignment mark.

11. An apparatus for forming a semiconductor thin film wherein a non-single crystal semiconductor layer is formed on a base layer made of an insulating material; said non-single crystal semiconductor layer is irradiated by light and crystallized for a first time; and said light is relatively moved to said base layer, thereby crystallizing for a second time said non-single crystal semiconductor layer, the apparatus comprising:
   a light source emitting said light;
   a homogenizer for homogenizing the intensity distribution of said light emitted from said light source;
   an amplitude-modulation means provided in an emitting light path of said homogenizer and performing the amplitude modulation such that the amplitude of said light of which the intensity distribution is homogenized; and
   a light projection optical system provided in an outgoing light path of said amplitude-modulation means and projecting the light of which the amplitude is modulated by said amplitude-modulation means on said non-single crystal semiconductor layer formed on said base layer.

12. An apparatus for forming a semiconductor thin film wherein a non-single crystal semiconductor layer is formed on a base layer made of an insulating material; said non-single crystal semiconductor layer is irradiated by light and crystallized for a first time; and said light is relatively moved to said base layer, thereby crystallizing for a second time said non-single crystal semiconductor layer, the apparatus comprising:

a light source emitting said light;

a homogenizer for homogenizing the intensity distribution of said light emitted from said light source;

an amplitude-modulation means provided in an outgoing light path of said homogenizer and performing the amplitude modulation such that the amplitude of said light of which the intensity distribution is homogenized;

a light projection optical system provided in an emitting light path of said amplitude-modulation means and projecting the light of which the amplitude is modulated by said amplitude-modulation means on said non-single crystal semiconductor layer formed on said base layer; and means for providing a low temperature point in the surface irradiated by said light.

* * * * *